United States Patent [19]

Hermann et al.

[11] Patent Number: 4,962,083
[45] Date of Patent: Oct. 9, 1990

[54] HIGH TEMPERATURE T1-BA-CA-CU-O AND T1-SR-CU-O SUPERCONDUCTOR

[75] Inventors: Allen M. Hermann; Zhengzhi Sheng, both of Fayetteville, Ark.

[73] Assignee: University of Arkansas, Fayetteville, Ark.

[21] Appl. No.: 155,247

[22] Filed: Feb. 12, 1988

[51] Int. Cl.$^5$ .................... C01F 11/02; C01G 3/02; C01G 15/00

[52] U.S. Cl. .................... 505/1; 252/521; 423/604; 423/624; 423/635; 501/123; 502/346; 505/783

[58] Field of Search .................... 501/123; 502/346; 423/604, 624, 635; 505/1, 783; 252/521

[56] References Cited

U.S. PATENT DOCUMENTS 4,880,773  11/1989  Itozaki .................... 505/1

OTHER PUBLICATIONS

Hasegawa, T., High $T_c$ Superconductivity of $(La_{1-x}Sr_x)_2CuO_4$-Effect of Substitution of Foreign Ions for Cu and La Superconductivity, Japan Journal Applied Physics, 26, No. 4, Apr. 20, 1987, L337-338.

Kishio, K., Effect of Lanthanide Ion Substitutions for Lanthanum Sites on Superconductivity of $(La_{1-x}Sr_x)_2CuO_4$, Japan Journal of Applied Physics, 26, No. 4, Apr. 20, 1987, L391-L393.

Ohshima, S., Superconducting and Structural Properties of the New $Ba_{1-x}Ln_xCuO_{3-y}$ Compound System (Ln=La, Ce, Pr, Nd, Sm, Eu, Gd, Tb, Dy, Ho, Er, and Yb), Japan Journal Applied Physics, 26, No. 5, May 20, 1987, L815-L817.

Tsurumi, S., High Tc Superconductivities of $A_2Ba_4Cu_6O_{14}$, Japan Journal Applied Physics, 26, No. 5, L856-L857.

Superconductivity News, vol. 1, No. 2, Aug. 1987, pp. 1, 2, and 6-8.

K. N. Yang, High Temperature Superconductivity in Rare Earth (R)-Barium Copper Oxides $(RBa_2)Cu_3O_{9-\delta}$, Solid State Communications, vol. 63, No. 6, pp. 515-519 (1987).

J. M. Ferrira, Long-Range Magnetic Ordering in the High-$T_C$ Superconductors $RBa_2Cu_3O_{7-\delta}$(R=Nd, Sm, Gd, Dy, and Er), The American Physical Society, 1988, vol. 37, No. 4.

J. M. Tarascon, Oxygen and Rare-Earth Doping of the 90-K Superconducting Perovskite $YBa_2Cu_3O_{7-x}$, The American Physical Society, 1987, vol. 36, No.1.

P. H. Hor, Superconductivity Above 90 K in the Square-Planar Compound System $ABa_2Cu_3O_{6+x}$ with A=Y, La, Nd, Sm, Eu, Gd, Ho, Er, and Lu, The American Physical Society, 1987, vol. 58, No. 18.

A. Khurana, Superconductivity Seen Above the Boiling Point of Nitrogen, Physics Today, Apr. 1987.

R. J. Cava, Bulk Superconductivity of 91 K in Single-Phase Oxygen-Deficient Perovskite $Ba_2YCu_3O_{9-\delta}$, The American Physical Society, 1987, vol. 58, No. 16.

Richert, "Atomic Substitution in $YBa_2Cu_3O_7$: Modification . . .", Amer. Vacuum Soc. Series 3, Nov. 6, 1987, pp. 277-283.

Saito, "High-Tc Superconducting Properties in $(Y_{x-1}Tl_x)Ba_2Cu_3O_7$", Physica 148B, 1987, pp. 336-338.

Primary Examiner—Paul Lieberman
Assistant Examiner—John Boyd
Attorney, Agent, or Firm—Hill, Van Santen, Steadman & Simpson

[57] ABSTRACT

A new high temperature superconductor with transition temperature above 120 K is disclosed. The superconductor in a preferred embodiment comprises T1RBaCuO wherein R is chosen from Group 2A elements excluding Ba. In another preferred embodiment, the superconductor comprises T1SrCuO. Processes for making high temperature superconductors are also disclosed.

8 Claims, 2 Drawing Sheets

HIGH TEMPERATURE T1-BA-CA-CU-O AND T1-SR-CU-O SUPERCONDUCTOR

BACKGROUND OF THE INVENTION

The present invention relates to high temperature superconductors.

Recently, there has been much work done on the development of high temperature superconductors. Recent developments have indicated that certain combinations of elements are superconducting. However, these compositions typically do not maintain their superconductive attributes at temperatures that exceed approximately 90 K. For example, recently, much work has centered on the use of ternary oxides containing rare earth elements, barium, and copper for superconductivity above the temperature of liquid nitrogen. But, these systems have limited transition temperatures, at or below 93 K, and thus their applications are limited.

U.S. patent application Ser. Nos. 082,222, 089,067, and 144,114, filed on Aug. 6, 1987, Aug. 25, 1987, and Jan. 15, 1988, respectively, in the name of the inventors of the present invention disclose superconductor systems. U.S. patent application Ser. No. 089,067 discloses, in part, a superconductor based on a R-Ba-Cu-O wherein R is chosen from the group of rare earth metals excluding praseodymium, cerium, and terbium. U.S. patent application Ser. No. 082,222 discloses, in part, a superconductor based on a Tb-R-Ba-Cu-O system wherein R is chosen from the group of rare earth metals excluding praseodymium, cerium, and terbium. U.S. patent application Ser. No. 144,114 discloses, in part, a superconductor based on a TlBaCuO system.

Although superconductors prepared pursuant to the systems disclosed in the above-identified patent applications have produced "high temperature" superconductors and yielded optomistic test results, superconductors prepared pursuant to the present invention have yielded higher transition temperatures. Indeed, based on the knowledge of the inventors, superconductors produced pursuant to the present invention have yielded the highest transition temperatures to date for any superconductor.

A superconductor with a higher transition temperature would be desirable for many reasons. Such a superconductor would: (1) facilitate the discovery of the correct theory on oxide superconductivity; (2) provide a framework for the search of higher temperature, even room temperature superconductors; (3) allow superconducting components to operate at higher temperatures with lower cost; and (4) provide low cost processing and manufacturability.

Furthermore, many of the superconductor compositions that have been proposed to date are based on rare earth metals. Due to the short supply and cost of these rare earth metals, the compositions constructed therefrom can be quite expensive.

Accordingly, there is a need for improved superconductors with higher transition temperatures.

SUMMARY OF THE INVENTION

The present invention provides improved superconductors with transition temperatures above 120 K. Furthermore, the present invention provides superconductors that contain no rare earth elements.

In an embodiment, the present invention preferably comprises a system comprising:

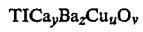

Tl-R-Ba-Cu-O wherein: R is a Group 2A element, excluding barium. Preferably, R is chosen from the group of elements consisting of strontium (Sr) and calcium (Ca).

In another embodiment, the system of the present invention comprises:

Tl-Sr-Cu-O

In a preferred embodiment, the superconductive system of the present invention has the following approximate stoichiometry:

TlCa$_y$Ba$_z$Cu$_u$O$_v$ wherein:
  y is greater than or equal to 0 and less than or equal to 5;
  z is greater than or equal to 0 and less than or equal to 5;
  y+z is greater than or equal to 0.2 and less than or equal to 5;
  u is greater than or equal to 0.5 and less than or equal to 15; and
  v is greater than or equal to z+y+u and less than or equal to 2+z+y+u.

In another preferred embodiment, the superconductive system of the present invention has the following approximate stoichiometry:

TlSr$_y$Ba$_z$Cu$_u$O$_v$ wherein
  y is greater than or equal to 0 and less than or equal to 5;
  z is greater than or equal to 0 and less than or equal to 5;
  y+z is greater than or equal to 0.2 and less than or equal to 5;
  u is greater than or equal to 0.5 and less than or equal to 15; and
  v is greater than or equal to z+y+u and less than or equal to 2+z+y+u.

In another preferred embodiment, the superconductive system of the present invention has the following approximate stoichiometry:

TlSr$_y$Cu$_u$O$_v$ wherein:
  y is greater than or equal to 0.2 and less than or equal to 5;
  u is greater than or equal to 0.5 and less than or equal to 15; and
  v is greater than or equal to y+u and less than or equal to 2+y+u A method of producing the high temperature superconductor system of the present is also provided. In an embodiment, the method allows the superconductor to be prepared at temperatures of between approximately 850° to about 950° C. in flowing oxygen. The method further allows the superconductor to be produced rapidly in about 30 minutes.

Accordingly, an advantage of the present invention is to provide a new superconductor with high transition temperatures.

A further advantage of the present invention is to provide a material system that may produce higher temperature superconductors, possibly even room temperature superconductors.

A still further advantage of the present invention is that it provides a new high temperature superconductor that is formed at a relatively low temperature, and allows for rapid production.

Furthermore, an advantage of the present invention is that it provides a method for making a new high temperature superconductor.

Still another advantage of the present invention is that it provides a method for rapidly making a high temperature superconductor.

Yet another advantage of the present invention is that it provides a method for making a superconductor having a transition temperature above 120 K.

Moreover, another advantage of the present invention is that it provides a superconductor system that does not include rare earth metals.

Another advantage of the present invention is that the high temperature superconductor can be used at temperatures near the boiling point of liquid nitrogen where higher critical currents are to be expected.

Additional advantages and features of the present invention are described in, and will be apparent from, the detailed description of the presently preferred embodiments and the drawings.

DETAILED DESCRIPTION OF THE PRESENTLY PREFERRED EMBODIMENTS

Figure 1:
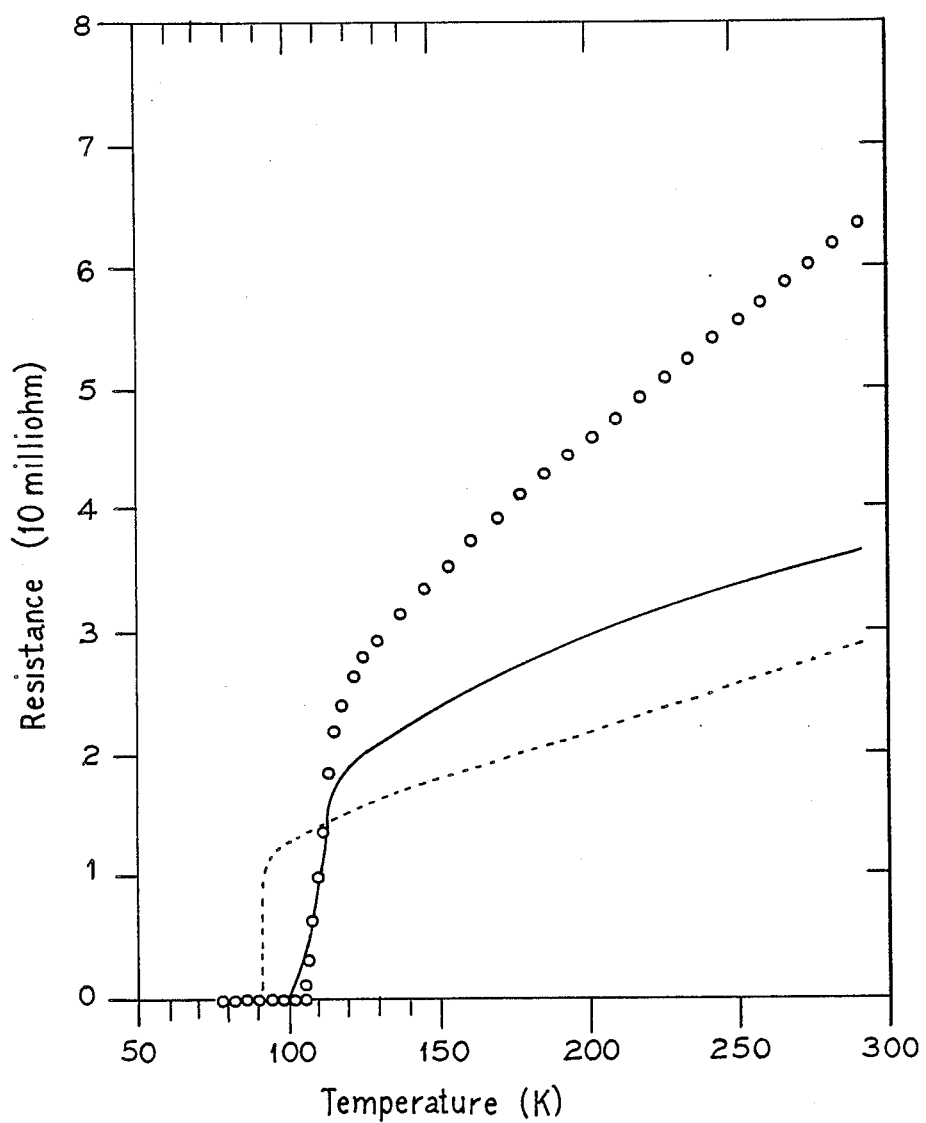
FIG. 1 illustrates a graph of electrical resistance versus temperature for three superconductor samples, the dashed line represents a Eu-Ba-Cu-O superconductor and the solid line and line represented by "O" depict samples based on a Tl-Ca-Ba-Cu-O superconductor system.

The present invention provides a new superconductor with transition temperature above 120 K. The present invention also provides a superconductor system that may produce higher temperature superconductors, even room temperature superconductors by further elemental substitution and variation of preparation procedures. In addition, the present invention provides a method for making these new high temperature superconductors.

To date, the inventors of the present invention are not aware of any superconductors that have transition temperatures above 100 K. Of course, low transition temperatures limit the applications of the superconductors. The inventors of the present invention have discovered a superconductor system that has a transition temperature above 120 K; which is at least 20 K higher than that of any known high temperature superconductor. Because of its higher transition temperature, the present invention provides a superconductor that can be operated at higher temperatures with lower cost. Furthermore, the inventors of the present invention have found that the high temperature superconductor system of the present invention can be rapidly produced at relatively low temperatures In an embodiment of the present invention, the system comprises:

$$TlRBaCuO$$

wherein:

R is an element chosen from Group 2A elements excluding barium.

Preferably, R is chosen from the group of elements consisting of calcium (Ca) and strontium (Sr).

In another embodiment of the present invention, the system comprises:

$$TlSrCuO$$

In a preferred embodiment, a superconductor based on the new superconductive system of the present invention has the following approximate stoichiometry:

$$TlCa_yBa_zCu_uO_v$$

wherein:

y is greater than or equal to 0 and less than or equal to 5;

z is greater than or equal to 0 and less than or equal to 5;

y+z is greater than or equal to 0.2 and less than or equal to 5;

u is greater than or equal to 0.5 and less than or equal to 15; and v is greater than or equal to z+y+u and less than or equal to 2+z+y+u.

In another preferred embodiment, a superconductor based on the new superconductive system of the present invention has the following approximate stoichiometry:

$$TlSr_yBa_zCu_uO_v$$

wherein:

y is greater than or equal to 0 and less than or equal to 5;

z is greater than or equal to 0 and less than or equal to 5;

Y+z is greater than or equal to 0.2 and less than or equal to 5;

u is greater than or equal to 0.5 and less than or equal to 15; and v is greater than or equal to z+y+u and less than or equal to 2+z+y+u.

In an embodiment, the superconductor of the present invention has the following approximate stoichiometry:

$$TlSr_yCu_uO_v$$

wherein:

y is greater than or equal to 0.2 and less than or equal to 5;

u is greater than or equal to 0.5 and less than or equal to 15; and v is greater than or equal to y+u and less than or equal to 2+y+u.

By way of example, and not limitation, examples of the new high temperature superconductors of the present invention will now be given.

EXAMPLE 1:

A. To create the superconductor of Example 1, the following reagents were utilized:
1. $Tl_2O_3$
2. CaO
3. $BaCO_3$
4. CuO B. The following procedure was followed using the above reagents to create a superconductor:

1. A mixture of a one molar portion of $BaCO_3$ and a three molar portion of CuO was ground with an agate mortar and pestle. The ground mixture was heated in air at approximately 925° C. for more than 24 hours (with several intermediate grindings) to obtain a uniform black $BaCu_3O_4$ powder.
2. The resultant $BaCu_3O_4$ powder was mixed with appropriate amounts of $Tl_2O_3$ and CaO to obtain a mixture with a nominal composition of $Tl_{1.86}CaBaCu_3O_{7.8+x}$, which was completely ground, and pressed into a pellet.
3. A tube furnace was heated to a temperature of between approximately 850° to about 950° C. with oxygen flowing therein.
4. The pellet was placed in the tube furnace maintaining the temperature and oxygen flow for approximately 2 to about 5 minutes.
5. The pellet was then taken out of the furnace and quenched in air to room temperature.

The samples prepared by this procedure had an onset temperature of above 120 K, a midpoint of about 110 K, and a zero resistance temperature of about 100 K. Qualitative magnetic examinations of the superconductor of this example demonstrate a strong Meissner effect, indicating a large volume fraction of superconducting phase.

EXAMPLE 2:

A. In this example, the following reagents were utilized:
1. $Tl_2O_3$
2. CaO
3. $BaCO_3$
4. CuO B. To produce a superconductor with these reagents, the following procedure was followed:
1. A mixture of a one molar portion of $BaCO_3$ and a three molar portion of CuO was ground with an agate mortar and pestle, heated in air at approximately 925° C. for more than 24 hours (with several intermediate grindings) to obtain a uniform black $BaCu_3O_4$ powder.
2. The resulting $BaCu_3O_4$ powder was mixed with appropriate amounts of $Tl_2O_3$ and CaO to obtain a mixture with a nominal composition of $Tl_{1.86}CaBaCu_3O_{7.8+x}$, which was completely ground, and pressed into a pellet.
3. A tube furnace was heated to a temperature of approximately 850° to about 950° C. with oxygen flowing therein.
4. The pellet was placed in the tube furnace maintaining the temperature and oxygen flow for approximately 2 to about 5 minutes.
5. The pellet was taken out of the furnace and quenched in air to room temperature.
6. The pellet was then annealed at approximately 450° C. in flowing oxygen for 6 hours.

The samples prepared by this procedure had an onset temperature of above 120 K, a midpoint of about 110 K, and a zero resistance temperature of about 100 K. FIG. 1 illustrates the resistance-temperature dependence for a superconductor sample prepared pursuant to this example. The sample is indicated by a solid line. By way of comparison, a superconductor based on Eu-Ba-Cu-O system is illustrated by dashed lines. Qualitative magnetic examinations of the samples demonstrated a strong Meissner effect, indicating a large volume fraction of superconducting phase.

EXAMPLE 3:

A. The following reagents were utilized in this example:
1. $Tl_2O_3$
2. CaO
3. $BaCO_3$
4. CuO B. The following procedure was followed:
1. A mixture of a one molar portion of $BaCO_3$ and a three molar portion of CuO was ground with an agate mortar and pestle, heated in air at 925° C. for more than 24 hours (with several intermediate grindings) to obtain a uniform black $BaCu_3O_4$ powder.
2. The resulting $BaCu_3O_4$ powder was mixed with appropriate amounts of $Tl_2O_3$ and CaO to obtain a mixture with a nominal composition of $Tl_2Ca_{1.5}BaCu_3O_{8.5+x}$, which was completely ground, and pressed into a pellet.
3. A tube furnace was heated to a temperature of approximately 850° to about 950° C. with oxygen flowing therein.
4. The pellet was placed in the tube furnace maintaining the temperature and oxygen flow for approximately 2 to about 5 minutes.
5. The pellet was then taken out of the furnace and quenched in air to room temperature.

The samples prepared by this procedure had an onset temperature of above 123 K, a midpoint of about 112 K, and a zero resistance temperature of about 103 K. Qualitative magnetic examinations of the samples showed a strong Meissner effect, indicating a large volume fraction of superconducting phase.

EXAMPLE 4:

A. The following reagents were utilized in this example:
1. $Tl_2O_3$
2. CaO
3. $BaCO_3$
4. CuO B. The following procedure was followed in this example:
1. A mixture of a one molar portion of $BaCO_3$ and a three molar portion of CuO was ground with an agate mortar and pestle, heated in air at 925° C. for more than 24 hours (with several intermediate grindings) to obtain a uniform black $BaCu_3O_4$ powder.
2. The resulting $BaCu_3O_4$ powder was mixed with appropriate amounts of $Tl_2O_3$ and CaO to obtain a mixture with a nominal composition of $Tl_2Ca_{1.5}BaCu_3O_{8.5+x}$, which was completely ground, and pressed int a pellet.
3. A tube furnace was heated to a temperature of between approximately 850° to about 950° C. with oxygen flowing therein.
4. The pellet was placed in the tube furnace maintaining the temperature and oxygen flow for approximately 2 to about 5 minutes.
5. The pellet was then furnace-cooled to room temperature.

The samples prepared by this procedure had an onset temperature of above 123 K, a midpoint of about 112 K, and a zero resistance temperature of about 103 K. FIG. 1 illustrates the resistance-temperature dependence for a superconductor sample prepared pursuant to this example. The sample is indicated by the line defined by "O" in the figure. Qualitative magnetic examinations of these samples demonstrated a strong Meissner effect, indicating a large volume fraction of superconducting phase.

EXAMPLE 5:

A. In this example, the following reagents were utilized:
1. $Tl_2O_3$
2. CaO
3. $BaCO_3$
4. CuO B. In this example, the following procedure was followed:
1. A mixture of a one molar portion of $BaCO_3$ and a three molar portion of CuO was ground with an agate mortar and pestle, heated in air at 925° C. for more than 24 hours (with several intermediate grindings) to obtain a uniform black $BaCu_3O_4$ powder.
2. The resulting $BaCu_3O_4$ powder was mixed with appropriate amounts of $Tl_2O_3$ and CaO to obtain a mixture with a nominal composition of $Tl_{1.5}Ca_{0.5}BaCu_3O_{6.8+x}$, which was completely ground, and pressed into a pellet.
3. A tube furnace was heated to a temperature of approximately 850° to about 950° C. with oxygen flowing therein.
4. The pellet was placed in the tube furnace maintaining the temperature and oxygen flow for approximately 2 to about 5 minutes.
5. The pellet was then taken out of the furnace and quenched in air to room temperature.

The samples prepared by this procedure had an onset temperature of about 120 K, a midpoint of about 110 K, and a zero resistance temperature of above liquid nitrogen temperature.

EXAMPLE 6:

A. The following reagents were utilized in this example:
1. $Tl_2O_3$
2. $SrCO_3$
3. CuO B. The following procedure was followed in this example:
1. A mixture of a 0.45 molar portion of $SrCO_3$ and a three molar portion of CuO was ground with an agate mortar and pestle, heated in air at 925° C. for more than 24 hours (with several intermediate grindings) to obtain a uniform black $Sr_{0.45}Cu_3O_{3.5}$ powder.
2. The resulting $Sr_{0.45}Cu_3O_{3.5}$ powder was mixed with appropriate amount of $Tl_2O_3$ to obtain a mixture with a nominal composition of $Tl_2Sr_{0.45}Cu_3O_{6.5+x}$, which was completely ground, and pressed into a pellet.
3. A tube furnace was heated to a temperature of between approximately 1000° to about 1050° C. with oxygen flowing therein.
4. The pellet was placed in the tube furnace maintaining the temperature and oxygen flow for approximately 2 to about 5 minutes.
5. The pellet was then taken out of the furnace and quenched in air to room temperature.

Figure 2:
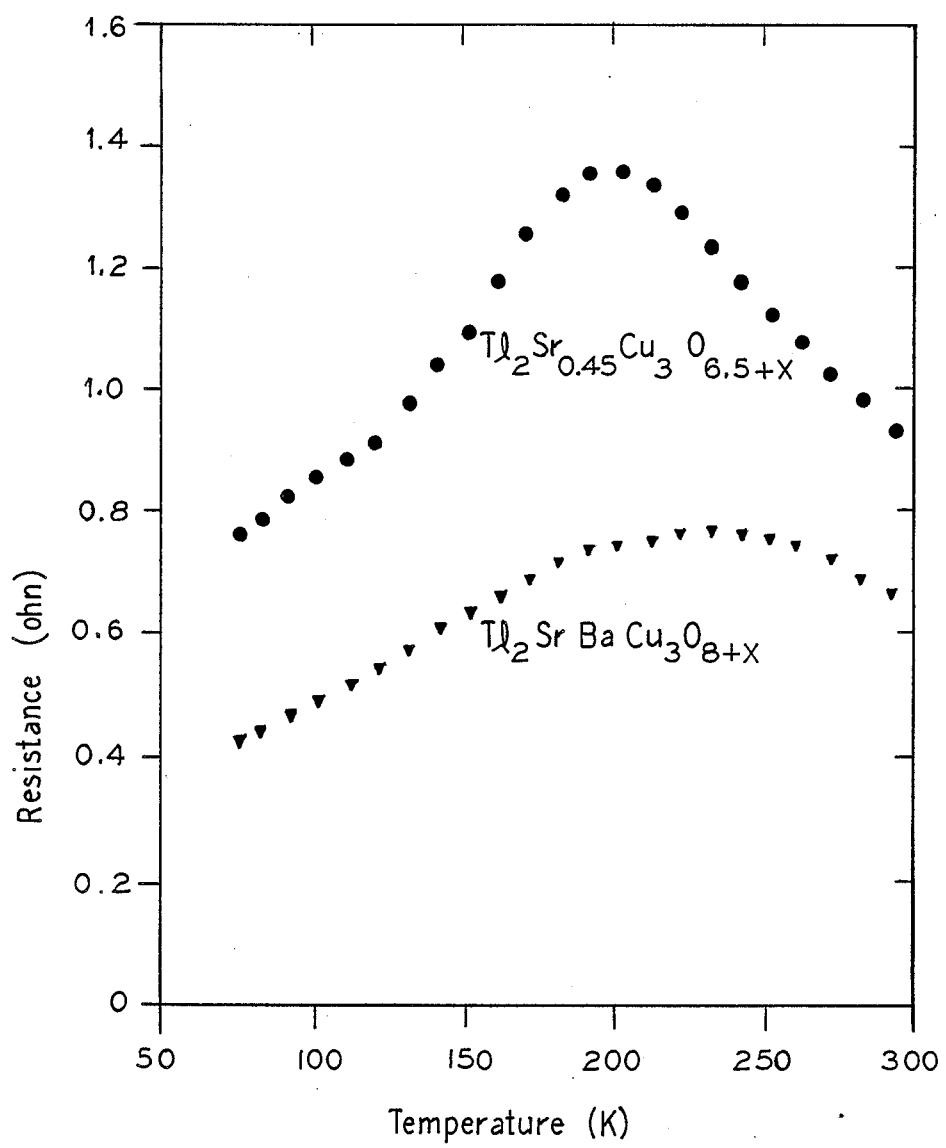
FIG. 2 illustrates a graph of electrical resistance versus temperature for two superconductor samples. ● represents a superconductor based on TlSrCuO, while ▼ represents a superconductor based on TlSrBaCuO.

Resistance-temperature dependence for a sample prepared pursuant to this example is illustrated in FIG. 2 as represented by the "●" line. Although resistance did not reach zero above liquid nitrogen temperature, it may reach zero at lower temperatures. In particular, a decrease in the resistance at about 200 K may originate from the onset of a high temperature superconducting phase of the sample.

EXAMPLE 7:

A. In this example, the following reagents were utilized:
1. $Tl_2O_3$
2. $SrCO_3$
3. $BaCO_3$
4. CuO B. In this example, the following procedure was followed:
1. A mixture of a one molar portion of $BaCO_3$ and a three molar portion of CuO was ground with an agate mortar and pestle, heated in air at 925° C. for more than 24 hours (with several intermediate grindings) to obtain a uniform black $BaCu_3O_4$ powder.
2. The resulting $BaCu_3O_4$ powder was mixed with appropriate amounts of $Tl_2O_3$ and $SrCO_3$ to obtain a mixture with a nominal composition of $Tl_2SrBaCu_3O_{8+x}$, which was completely ground, and pressed into a pellet.
3. A tube furnace was heated to a temperature of between approximately 900° to about 950° C. with oxygen flowing therein.
4. The pellet was placed in the tube furnace maintaining the temperature and oxygen flow for approximately 2 to about 5 minutes.
5. The pellet was then taken out of the furnace and quenched in air to room temperature.

Resistance-temperature dependance for the sample prepared pursuant to this example is illustrated in FIG. 2 as the "▲" line. Although the resistance did not reach zero above liquid nitrogen temperature, it may reach zero at lower temperatures. In particular, a decrease in resistance at about 250 K may originate from onset of a high temperature superconducting phase of the sample.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A composition having superconductor properties that has the following approximate stoichiometry:

$$TlCa_yBa_zCu_uO_v$$

wherein:
y+z is greater than or equal to 0.2 and less than or equal to 5;
z is greater than 0 and less than 5;
y is greater than 0 and less than 5;
u is greater than or equal to 0.5 and less than or equal to 15; and
v is greater than or equal to z+y+u and less than or equal to 2+z+y+u.

2. A composition having superconductor properties that has the following approximate stoichiometry:

$$TlSr_yBa_zCu_uO_v$$

wherein:
y+z is greater than or equal to 0.2 and less than or equal to 5;
z is greater than 0 and less than 5;
y is greater than 0 and less than 5;
u is greater than or equal to 0.5 and less than or equal to 15; and
v is greater than or equal to z+y+u and less than or equal to 2+z+y+u.

3. A composition having superconductive properties that has the following approximate stoichiometry:

$$TlSr_yCu_uO_v$$

wherein:
y is greater than 0.2 and less than or equal to 5;
u is greater than or equal to 0.5 and less than or equal to 15; and
v is greater than or equal to y+u and less than or equal to 2+y+u.

4. A high temperature superconductor comprising a melt produced complex having the nominal composition:

$$Tl_{1.86}CaBaCu_3O_{7.8+x}.$$

5. A high temperature superconductor comprising a melt produced complex having the nominal composition:

$$Tl_2Ca_{1.5}BaCu_3O_{8.5+x}.$$

6. A high temperature superconductor comprising a melt produced complex having the nominal composition:

$$Tl_{1.5}Ca_{0.5}BaCu_3O_{6.8+x}.$$

7. A high temperature superconductor comprising a melt produced complex having the nominal composition:

$$Tl_2Sr_{0.45}Cu_3O_{6.5+x}.$$

8. A high temperature superconductor comprising a melt produced complex having the nominal composition:

$$Tl_2SrBaCu_3O_{8+x}.$$

* * * * *

UNITED STATES PATENT AND TRADEMARK OFFICE
CERTIFICATE OF CORRECTION

PATENT NO. : 4,962,083

DATED : October 9, 1990

INVENTOR(S) : Zhengzhi Sheng, et al

It is certified that error appears in the above-identified patent and that said Letters Patent is hereby corrected as shown below:

On the title page, Item [75] should read as follows:

--Zhengzhi Sheng--

--Allen M. Hermann--

On the title page, Item [19] should read as follows:

--Sheng--

The names of the attorney, agent or firm should read as follows:

--Hermann Ivester and Hill, Van Santen, Steadman & Simpson--

Signed and Sealed this

Twenty-second Day of September, 1992

Attest:

DOUGLAS B. COMER

Attesting Officer

Acting Commissioner of Patents and Trademarks